(12) United States Patent
Bernstein et al.

(10) Patent No.: US 6,288,544 B1
(45) Date of Patent: Sep. 11, 2001

(54) METHOD FOR REDUCING IMAGE ARTIFACTS CAUSED BY PATIENT MOTION DURING MR IMAGING

(75) Inventors: Matthew A. Bernstein, Waukesha; Tsur Bernstein, Glendale, both of WI (US)

(73) Assignee: GE Medical Systems Global Technology Company LLC, Waukesha, WI (US)

(*) Notice: Subject to any disclaimer, the term of this patent is extended or adjusted under 35 U.S.C. 154(b) by 0 days.

(21) Appl. No.: 09/552,177

(22) Filed: Apr. 18, 2000

Related U.S. Application Data

(62) Division of application No. 08/990,651, filed on Dec. 15, 1997.

(51) Int. Cl.$^7$ ........................................... G01V 3/00
(52) U.S. Cl. ........................ 324/309; 324/307; 324/300
(58) Field of Search ........................... 324/309, 307, 324/300; 600/412, 549

(56) References Cited

U.S. PATENT DOCUMENTS

| | | | |
|---|---|---|---|
| 5,912,557 | * | 6/1999 | Wilman et al. ............... 324/309 |
| 6,201,393 | * | 3/2001 | Bernstein et al. ............. 324/309 |

\* cited by examiner

Primary Examiner—Christine Oda
Assistant Examiner—Brij B. Shrivastav
(74) Attorney, Agent, or Firm—Quarles & Brady LLP; Christian G. Cabou

(57) ABSTRACT

An MRI system acquires MRA data from two overlapping thin slabs using a 3DTOF pulse sequence. Motion artifacts are reduced by using a reverse centric phase encode order during the first thin slab acquisition and a centric phase encode order during the second thin slab acquisition. Patient movement is reduced by producing a uniform sound with gradient pulse sequences during the interval between thin slab acquisitions and during a preparation period prior to the first thin slab acquisition.

6 Claims, 4 Drawing Sheets

METHOD FOR REDUCING IMAGE ARTIFACTS CAUSED BY PATIENT MOTION DURING MR IMAGING

RELATED APPLICATIONS

This application is a division of U.S. application Ser. No. 08/990,651 filed on Dec. 15, 1997 and entitled "A METHOD FOR REDUCING IMAGE ARTIFACTS CAUSED BY PATIENT MOTION DURING MR IMAGING".

BACKGROUND OF THE INVENTION

The field of the invention is nuclear magnetic resonance imaging methods and systems. More particularly, the invention relates to the reduction of patient motion during an MRI scan and to the reduction of image artifacts caused by such motion.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The present invention will be described in detail with reference to a variant of the well known Fourier transform (FT) imaging technique, which is frequently referred to as "spin-warp". The spin-warp technique is discussed in an article entitled "Spin-Warp NMR Imaging and Applications to Human Whole-Body Imaging" by W. A. Edelstein et al., *Physics in Medicine and Biology*, Vol. 25, pp. 751–756 (1980). It employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed.

In a three-dimensional implementation of the spin-warp method phase encoding of the spin-echo signals is performed along two orthogonal axes. As described in U.S. Pat. No. 4,431,968 entitled "Method of Three-Dimensional NMR Imaging Using Selective Excitation," a thick slab of spins is excited by applying a slab-selection gradient ($G_z$) in the presence of a selective RF excitation pulse and then a first phase encoding gradient ($G_z$) along the same axis and a second phase encoding gradient ($G_y$) are applied before the NMR signal acquisition in the presence of a readout gradient ($G_x$). For each value of the $G_z$ phase encoding gradient, the $G_y$ hase encoding is stepped through all its values to sample a three-dimensional region of k-space. By selectively exciting a slab, NMR signals are acquired from a controlled 3-dimensional volume.

MR angiography (MRA) has been an active area of research. The time-of-flight (TOF) method of MRA uses the motion of the blood relative to the surrounding tissue as a contrast mechanism. The most common approach is to exploit the differences in signal saturation that exist between flowing blood and stationary tissue. This is known as flow-related enhancement, but this effect is misnamed because the improvement in blood-tissue contrast is actually due to the stationary tissues experiencing many excitation pulses and becoming saturated. Flowing blood, which is moving through the excited section, is continually refreshed by spins experiencing fewer excitation pulses and is, therefore, less saturated. The result is the desired image contrast between the high-signal blood and the low-signal stationary tissues.

When 3D imaging methods are employed to produce an MRA image, the size of the excited slab becomes a limiting factor. To improve the diagnostic utility of the MRA image it is desirable to increase the slab thickness to increase the field of view along the slab-select axis. However, time-of-flight (TOF) MRA images decrease in quality as the slab thickness increases due to the saturation of the spins as they flow through the excited slab. That is, due to the increased thickness of the excited slab, blood remains in the slab for a longer time and becomes saturated by the selective RF excitation pulse. As a result, fresh blood entering the slab appears much brighter in the reconstructed image than blood which has remained in the slab for a number of excitations.

One solution to this problem is to acquire NMR data from the desired three-dimensional region by sequentially exciting a series of thin slabs and concatenating the NMR data acquired therefrom. As described in U.S. Pat. No. 5,167,232 entitled "Magnetic Resonance Angiography By Sequential Multiple Thin Slab Three Dimensional Acquisition," the thin slabs are often overlapped because slices on each slab boundary suffer from signal loss due to imperfect slab excitation profiles. Without this thin slab overlap, a "Venetian blind" artifact is normally produced.

Overlapping thin slabs are acquired by sampling some of the locations along the thin slab boundaries twice. The final image of the overlap region is obtained by using a maximum intensity projection (MIP) of each reconstructed image data set.

A problem with acquiring overlapping image data sets is that they cannot be properly registered if the patient moves during the time period between the thin slab acquisitions. Such mis-registration can produce vessels which appear "double" in the overlap region, and this is a severe artifact that can result in a misdiagnosis.

SUMMARY OF THE INVENTION

The present invention is a method for reducing patient movement during on MRI scan and for reducing the affects of patient motion during a scan. It has been discovered that the sound produced by the repeated application of gradient pulses during an MRI scan can cause patients to move. At the beginning of a scan when the gradients are first applied, the resulting sudden knocking, or banging, sound can startle patients and cause them to move for a portion of the data acquisition. Also, when the scan is conducted in separate intervals, as when acquiring two or more thin slabs, the pause in the gradient sound and then its sudden re-application can cause patients to move.

One aspect of the present invention is the application of gradient pulse sequences prior to the commencement of an MRI image acquisition to accustom the patient to the sound that occurs during the scan. When used prior to an MRI image acquisition, the gradient pulse sequence is produced at a low amplitude and is repeated at increasing amplitudes until the sound produced is substantially the same as that produced during the image acquisition. When used between two MRI image acquisitions, the gradient pulse sequence is produced at a level which maintains the sound substantially constant during the time interval between acquisitions.

Another aspect of the invention is the reduction of image artifacts caused by motion occurring during two successive image acquisitions. The first image is acquired using a reverse centric phase encode order in which the central views of k-space are acquired late in the acquisition, and the second image is acquired with a centric phase encode order in which the central views of k-space are acquired early in the acquisition. As a result, the central views in both images are acquired with minimal elapsed time between them. Since the central views are the primary determinant of the location of structures in the reconstructed images, minimizing the time interval between the acquisition of the center of k-space for the two images minimizes the likelihood of misregistering structures and producing a double vessel artifact.

DESCRIPTION OF THE PREFERRED EMBODIMENT

Figure 1:
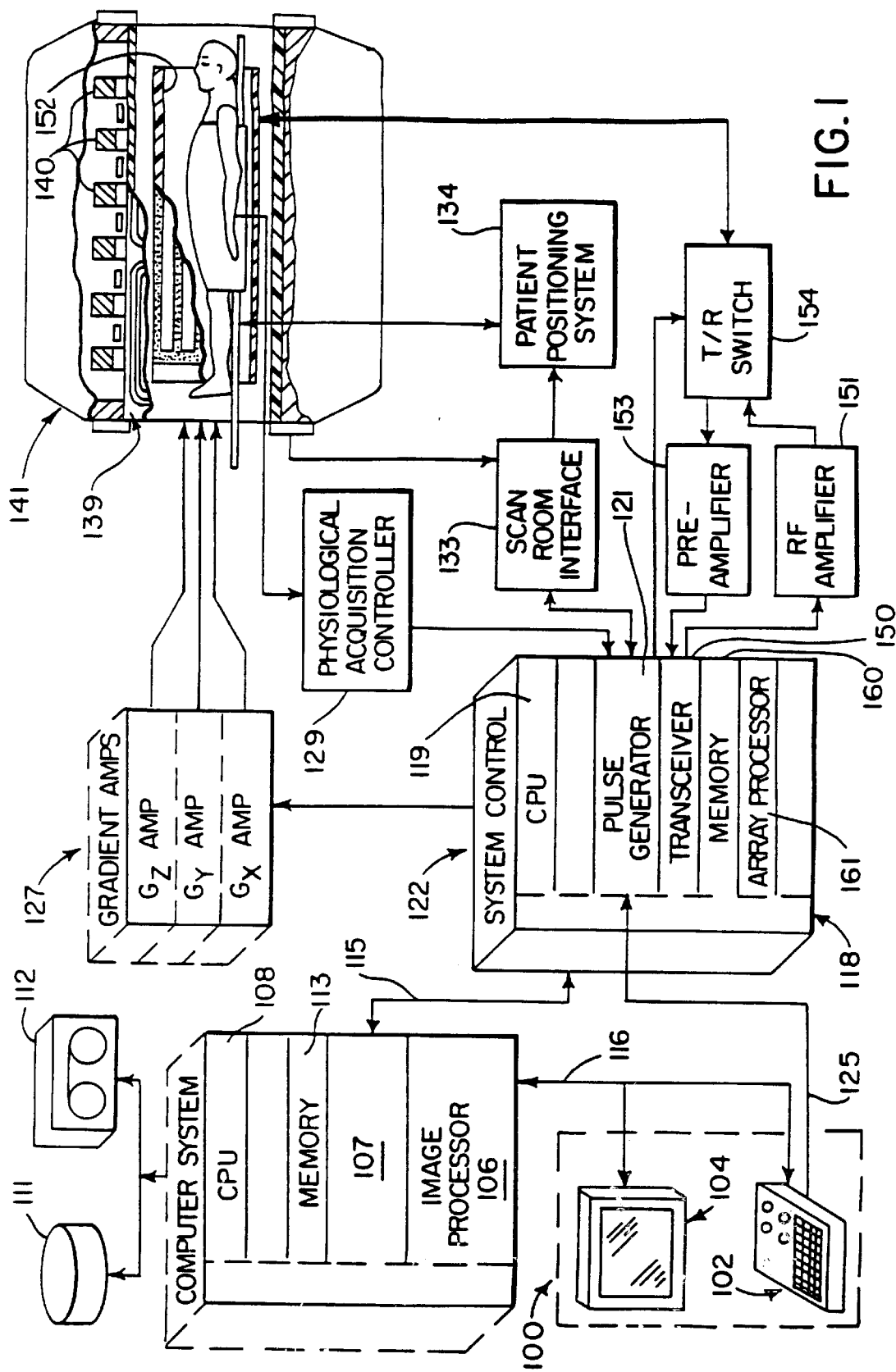
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$, and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
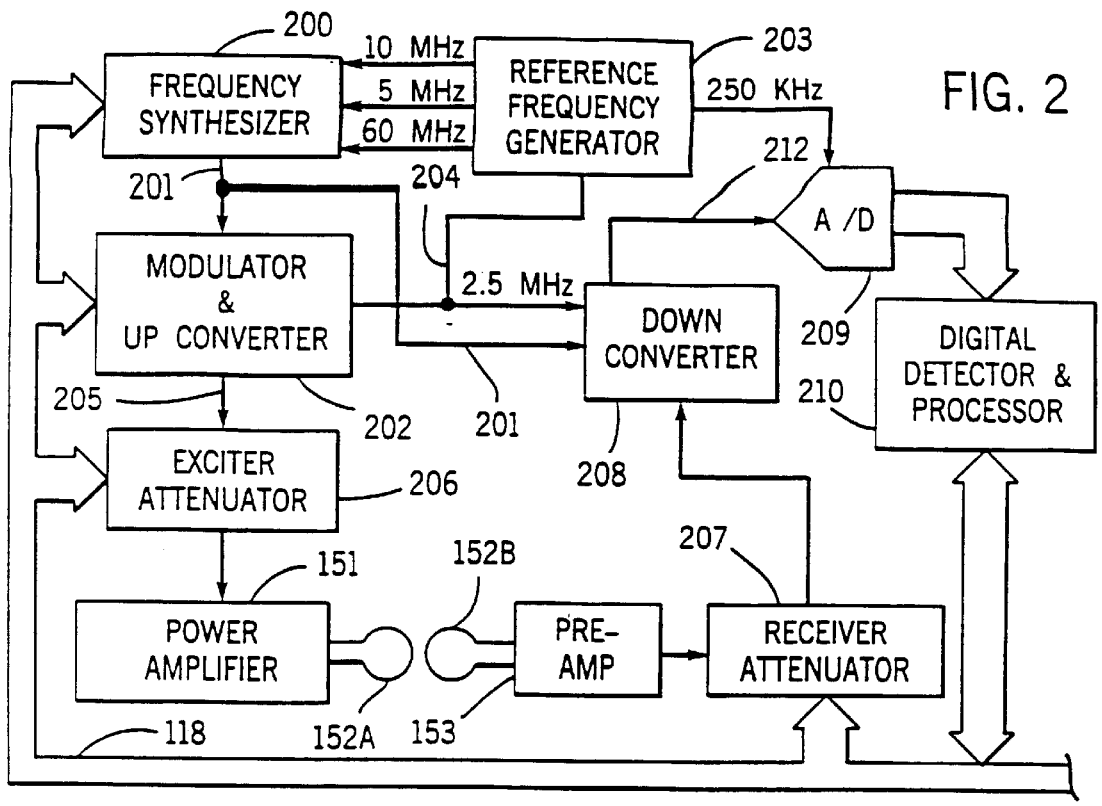
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

Figure 3:
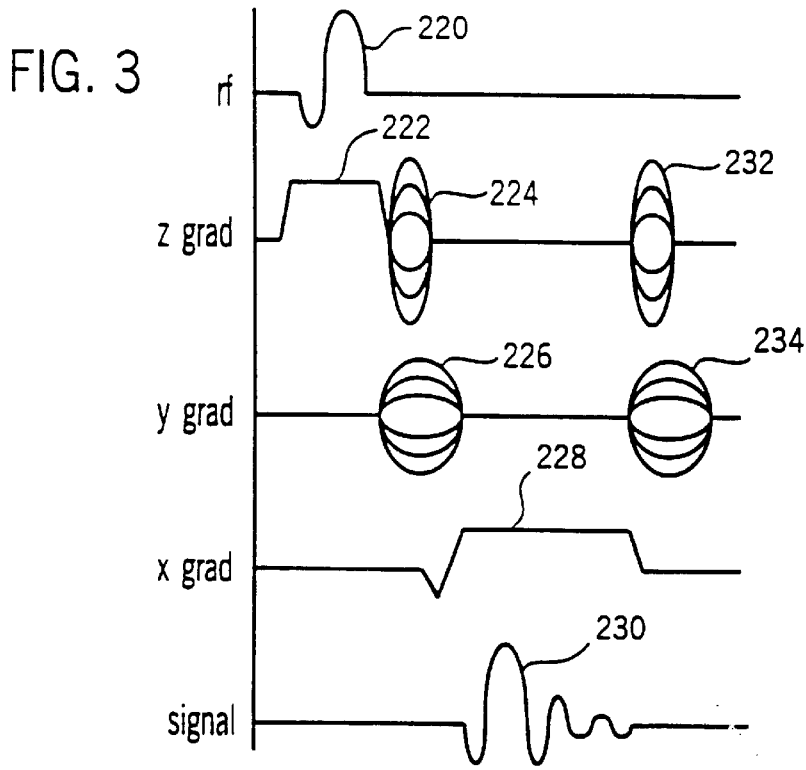
FIG. 3 is a graphic representation of the pulse sequence employed in the MRI system of FIG. 1 to practice the preferred embodiment of the invention.

Although the present invention can be used with a number of different pulse sequences, the preferred embodiment of the invention employs a 3D gradient recalled echo pulse sequence depicted in FIG. 3. The pulse sequence "3DTOF" available on the General Electric 1.5 Tesla MR scanner sold under the trademark "SIGNA" was used.

Referring particularly to FIG. 3, an RF excitation pulse 220 having a flip angle of from 20° to 50° is produced in the presence of a slab-select gradient pulse 222 to produce transverse magnetization in a 3D slab having a thickness of 5 mm to 100 mm as taught in U.S. Pat. No. 4,431,968. This is followed by a phase encoding gradient pulse 224 directed along the z axis and a phase encoding gradient pulse 266 directed along the y axis. A readout pulse 228 directed along the x axis follows and a partial echo (60%) NMR signal 230 is acquired and digitized as described above. After the acquisition, rewinder gradient pulses 232 and 234 rephase the magnetization before the pulse sequence is repeated as taught in U.S. Pat. No. 4,665,365.

As is well known in the art, the pulse sequence is repeated and the phase encoding pulses 224 and 226 are stepped through a series of values to sample the 3D k-space. In the preferred embodiment 32 phase encodings are employed along the z axis and 256 phase encodings are employed along the y axis. For each particular y phase encoding, therefore, 32 acquisitions with 32 different z phase encodings are performed to sample completely along the $k_z$ axis. This is repeated 256 times with 256 different y phase encodings to sample completely along the $k_y$ axis. As will become apparent from the discussion below, the order in which this k-space sampling is performed is an important aspect of the present invention.

Sampling along the $k_x$ axis is performed by sampling the echo signal 230 in the presence of the readout gradient pulse 228 during each pulse sequence. It will be understood by those skilled in the art that only a partial sampling along the $k_x$ axis is performed and the missing data is computed using a homodyne reconstruction or by zero filling. This enables the echo time (TE) of the pulse sequence to be shortened and the pulse repetition rate (TR) to be shortened.

One aspect of the present invention is the order in which k-space is sampled using the pulse sequence in FIG. 3. The sampling of k-space is performed by stepping the magnitude of the y and z phase encoding pulses 226 and 224 through a sequence of values and the order in which this is done determines how k-space is sampled during the scan.

Figure 6:
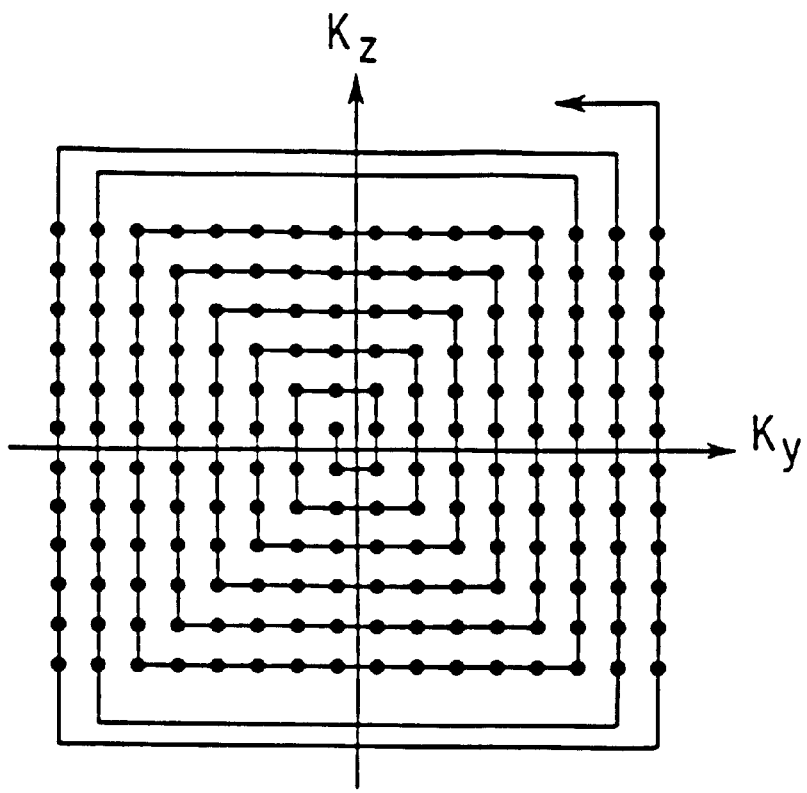
FIG. 6 is a graphical representation of a spiral K-space sampling pattern. level produced by the gradient fields during the acquisition of FIG. 4.

Centric view ordering as described in U.S. Pat. No. 5,122,747 scans k-space in a spiral pattern as shown in FIG. 6, starting at the center of k-space an working outward to the peripheral views. Since the central samples, or views, contain the majority of the structural information about the patient, the timing of the acquisition of these central views is important. The peripheral views, which sample k-space far from its center, are acquired later in the centric view order scan and they contain far less structural information.

The spiral sampling pattern in FIG. 6 can also be traversed in the reverse direction. In this case the less important peripheral k-space samples are acquired first during the scan and the sampling spirals inward to acquire the more important central views at the end of the scan. This is referred to herein as a "reverse centric phase encode view order".

Figure 4:
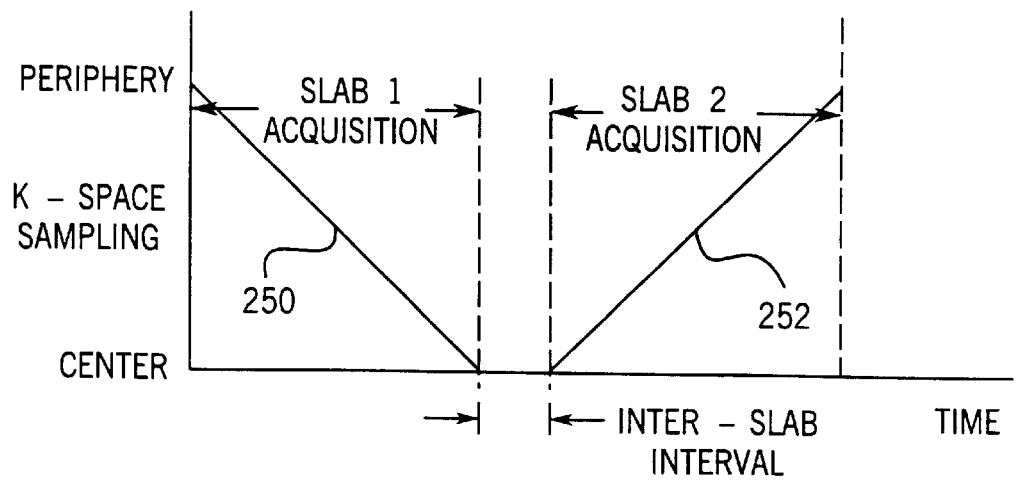
FIG. 4 is a graphic representation of the order in which k-space is sampled according to the present invention using the pulse sequence of FIG. 3.

A multi-slab acquisition using the pulse sequence of FIG. 3 is performed to acquire NMR image data from two overlapping slabs. As illustrated in FIG. 4, the first slab is acquired during a first slab acquisition period using a reverse centric phase encode view order as indicated by line 250. As described above, the peripheral views of k-space are sampled first, and the sampling spirals inward to sample the central views last. Typically, this first slab acquisition will require about 310 seconds. This is followed by a short inter-slab interval of approximately 0.5 seconds during which the MRI system prepares for another image acquisition.

Referring still to FIG. 4, a second slab is acquired during a second slab acquisition period that commences immediately after the inter-slab interval. This requires the same acquisition time as the first slab acquisition, but in this second acquisition k-space is sampled in centric view order as indicated by line 252. As a consequence, the center of k-space is sampled in the second slab acquisition as close as possible in time to the sampling of the center of k-space during the first slab acquisition. The reverse centric view ordering followed by centric view ordering thus minimizes the time interval in which the patient can move, and thus minimizes the mis-registration of the two reconstructed images.

The above method for reducing mis-registration between over lapping slab acquisitions assumes that patient motion occurs substantially uniformly throughout the scan. It has been discovered, however, that this is not true in most scans. Instead, patients react to the change in sound level produced by the gradient field pulses during the scan. This sound can be described as a "banging" sound and is caused by the mechanical movement of the gradient coils and supporting structure as the gradient pulses 222, 224, 226, 228, 232 and 234 are applied. The magnitude of the sound produced by the slab select gradient 222 and readout gradient 228 remain constant throughout each slab acquisition, but the magnitude of the sound produced by the phase encoding pulses 224 and 226 and their rewinder pulses 232 and 234 change during the scan. The sound level increases as the peripheral regions of k-space are sampled because the gradient pulses are larger.

There are three periods of time in the scan depicted in FIG. 4 when changes in the gradient sound level cause an increase in patient movement. The first period is at the beginning of the first slab acquisition when the gradients are suddenly turned on to begin sampling the periphery of k-space at their maximum sound level. Even though patients are forewarned, many are startled by the sudden sound and move involuntarily. The same startle reaction also occurs at the beginning of the second slab acquisition, and although the movement is usually not as much as at the beginning of the first slab acquisition, its affect is greater because the very important central views of k-space are being sampled at that moment.

The third period in which patient motion is common is during the inter-slab interval when the data acquisition is stopped. The banging sound terminates and patients mistakenly conclude that the examination is complete. As a result, they feel free to move, and often do. As indicated above, patient movement between slab acquisitions is particularly troublesome and can require that the scan be repeated from the start.

The present invention recognizes that patients respond to the sound level of the MRI system and that the sound level must be properly managed during the scan. This is accomplished in the preferred embodiment by playing out the pulse sequence of FIG. 3 during the time interval before the first slab acquisition and during the inter-slab interval, but without producing the RF excitation pulse 220 and without acquiring an NMR echo signal 230. The sound level is managed by changing the amplitude of the gradient field pulses to eliminate sudden changes in sound level that might startle a patient.

Figure 5:
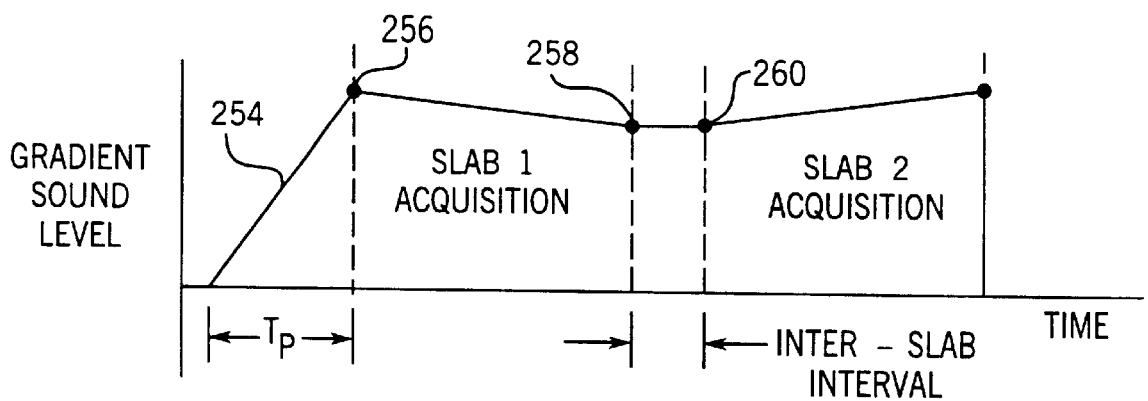
FIG. 5 is a graphic representation of the sound

Referring particularly to FIG. 5, during a preparation period ($T_p$) before the first slab acquisition, the gradient sound level is ramped up gradually as indicated by line 254 to a sound level at point 256 equal to that produced by the first slab 1 acquisition. The preparation period $T_p$ is from 1.0 to 10 seconds in duration and the magnitude of the gradient pulses are gradually increased from zero to the level required for the first data acquisition sample at point 256. The increase in gradient amplitude ($\Delta G$) for each pulse sequence during the preparation period is calculated as follows:

$$\Delta G = G_{in}/(T_p/TR),$$

where $G_{in}$ is the initial value of the gradient pulse at point 256, $T_p$ is the preparation period and TR is the pulse sequence repetition period. The gradient pulses are played out by the pulse generator module 121 in the usual manner, but their amplitudes are changed before being applied to the gradient amplifiers 127.

Referring still to FIG. 5, the present invention is also employed to produce sound during the inter-slab interval. In this case the sound level at the end of the first slab acquisition indicated at point 258 is maintained by simply performing the pulse sequence with the same gradient pulse amplitudes. Since these same gradient pulse amplitudes are used at the beginning of the second slab acquisition (i.e. the center of k-space) at point 260, the sound level is maintained constant throughout the inter slab interval.

It should be apparent to those skilled in the art that management of MRI system sound according to the present invention can be used in many different scans where patient motion is an issue. The gradient pulse sequence can be ramped up at the beginning of any MR scan to avoid startling the patient and it can be used during the intervals in any multi-pass scan. The duration of the gap between the completion of one pass and the start of the next pass depends on the specific imaging pulse sequence being used, and may range from several milliseconds, to a second.

The use of the reverse-centric and centric view order is compatible with any two pass MR scan in which patient motion is a concern. It is most useful, however, for the two-slab motsa scan described in the preferred embodiment.

What is claimed is:

1. A method for performing a scan with an MRI system, the steps comprising:

performing a gradient pulse sequence during a preparation period to produce a sound level in the MRI system which gradually increases; and performing an imaging pulse sequence to acquire NMR data from a patient in the MRI system and from which a first image is reconstructed;

wherein the sound level produced at the end of the preparation period is substantially the same level as the sound level produced in the MRI system by the imaging pulse sequence.

2. The method as recited in claim 1 in which the gradient pulse sequence produces gradient pulses that are substantially the same in shape as gradient pulses produced by the imaging pulse sequence.

3. The method as recited in claim 1 in which the imaging pulse sequence is performed during a second acquisition to acquire NMR data from the patient from which a second image is reconstructed; and in which the gradient pulse sequence is performed during a time interval between the first and second image acquisitions to maintain the sound level produced in the MRI system at a substantially constant level.

4. The method as recited in claim 3 in which the first image is acquired using a reverse centric phase encode order and the second image is acquired using a centric phase encode order.

5. A method for performing a two pass scan with an MRI system, the steps comprising:

performing a first pass using an imaging pulse sequence to acquire NMR data from a patient in the MRI system and from which an image may be reconstructed;

performing a second pass using an imaging pulse sequence to acquire NMR data from the patient and from which an image may be reconstructed; and performing a gradient pulse sequence during a time period between the completion of the first pass and the start of the second pass;

wherein the sound level produced during said time period is substantially the same level as the sound level produced in the MRI system by the imaging pulse sequence during the first and second passes.

6. The method as recited in claim 5 in which the image is acquired during the first pass using a reverse centric phase encode order and the image is acquired during the second pass using a centric phase encode order.

* * * * *